United States Patent [19]

Russin

[11] 3,950,697

[45] Apr. 13, 1976

[54] APPARATUS FOR MEASURING PHASE, AMPLITUDE AND FREQUENCY CHARACTERISTICS OF AN OBJECT

[76] Inventor: Leonid Petrovich Russin, ulitsa Nelidovskaya, 22, kv. 18, Moscow, U.S.S.R.

[22] Filed: Dec. 18, 1974

[21] Appl. No.: 533,840

[52] U.S. Cl. ............................................. 324/57 R
[51] Int. Cl.² ........................................ G01R 27/00
[58] Field of Search ................................. 324/57 R

[56] References Cited
UNITED STATES PATENTS
3,612,993   10/1971   Tims et al. ..................... 324/57 R

*Primary Examiner*—Stanley T. Krawczewicz
*Attorney, Agent, or Firm*—Holman & Stern

[57] ABSTRACT

A device for measuring parameters of a dynamic object, in which device the output of a source of periodic oscillations with a dynamic object connected thereto is electrically coupled via a switch to the input of a regulable phase shift unit whose output is connected to a first input of a difference signal unit with a regulable amplification factor at one of its inputs, and to a second input of said difference signal unit whose output is electrically connected to an indication unit. With the switch being in its first position, the output of the dynamic object is connected to the second input of the difference signal unit, whereas the output of the source of periodic oscillations is connected to the input of the regulable phase shift unit, which makes it possible to measure the phase shift of the dynamic object within a range of 0° to −180°, as well as to take measurements of the speed of response, the ratio between the electric signal amplitudes at the output and input of said dynamic object, and the capacitance and inductance of its components. With the switch being in its second position, the output of the source of periodic oscillations is connected to the second input of the difference signal unit, whereas the output of the dynamic object is connected to the input of the regulable phase shift unit, which makes it possible to measure the phase shift of signals at the input and output of said dynamic object, which is in excess of 180°, as well as frequency values of the source of periodic oscillations.

4 Claims, 9 Drawing Figures

APPARATUS FOR MEASURING PHASE, AMPLITUDE AND FREQUENCY CHARACTERISTICS OF AN OBJECT

FIELD OF THE INVENTION

The present invention relates to electric oscillation measuring devices and, more particularly, to a device for measuring parameters of a dynamic object, which device is primarily employed for measuring phase shifts between signals an the input and output of a dynamic object, the ratios of amplitudes of these signals, oscillation frequency values, and capacitance and inductance values. The proposed device is intended for measuring paramters of individual portions of automatic control systems and of entire automatic control systems, as well as for checking different types of inspection and test benches, steering gears and other dynamic objects. The device is equally applicable for testing both linear and non-linear dynamic objects and is marked by high noise immunity, which makes it possible to carry out high-accuracy measurements in the presence of noises whose amplitude is more than 10 times as high as that of a signal being measured.

BACKGROUND OF THE INVENTION

At present, researchers studying the stability and quality characteristics of automatic control systems and their dynamic components make an increasing use of experimental methods alongside the more conventional analytical methods. Experiments play an especially prominent role in assessing the quality characteristics of an automatic control system prior to putting the latter into operation, since its actual characteristics may differ from estimated performance.

In the course of such experimental checking, the system and its individual components can undergo a whole series of tests, including measurements of frequency amplitude and phase characteristics, the speed of response, the frequency of self-oscillation which may appear, and the electric capacitance and inductance. As a rule, such measurements are accompanied by a high noise level in the signals being measured.

Today tests of this kind involve a great number of different instruments, each of these instruments being intended for measuring only one or two characteristics (for example, only the phase shift or only the harmonic oscillation frequency). In addition, the known instruments have a narrow frequency range, are too sophisticated and bulky and display an extremely low measurement accuracy for non-sinusoidal signals, which shape is typical of non-linear systems. They are also ineffective in cases of a high noise level.

Thus, this field of technology is facing the problem of providing a sufficiently universal measuring instrument which would be capable of operating in a broad frequency range, would ensure high measurement accuracy in the presence of high noise levels and great constant signal components, and, finally, would be reliable and simple to manufacture, adjust and operate.

A device is known in the prior art, for measuring parameters of dynamic objects.

This foregoing prior art device comprises a periodic oscillation generator which generates sinusoidal and non-sinusoidal signals applied to two multipliers that are connected in parallel. One of these signals is applied to the input of a dynamic object being measured. From the output of the dynamic object, the signal is applied via an input converter to second inputs of the multipliers. Connected to the output of each multiplier, via integrating amplifiers, are two indicators. One of the indicators measures the imaginary component, and the other, the actual component of the amplitude-phase frequency characteristics of the dynamic object.

With all its complexity, the foregoing prior art device only makes it possible to measure the imaginary and actual components of amplitude-phase frequency characteristics. To determine the phase shift and amplitudes ratio requires a series of complicated calculations which involve such operations as squaring and root extraction, as well as the use of trigonometric functions. The starting point for these calculations is the value of the imaginary and actual signal components measured by the two indicators. This reduces the accuracy of measurements by 10 to 20 percent. In addition, the measurements take much time.

Apart from the foregoing factors, the presence of constant components in signals being measured reduces the accuracy of measurements, which accuracy is affected by the zero drift of the integrating amplifiers. The inadequate noise immunity of the prior art device in question also accounts for a reduced measurement accuracy. In the course of investigating a dynamic object taken as a whole, it is impossible, by using this device, to study its individual components, which is often necessary in investigating different types of dynamic objects.

A device is also known in the prior art, for measuring the phase shift and amplitude, the device comprising two selsyns with connected stator windings. The rotor of one of the selsyns is set in motion by a variable speed drive including a servo-amplifier and a tachogenerator. The rotor of the driven selsyn is excited from the outside, by the servosystem circuit when investigating an alternating current control system, and by an in-built generator when investigating an alternating current system.

Connected to the shaft of the rotating selsyn is a synchronizing switch which passes a sawtooth signal.

In addition, the foregoing prior art device includes a carrier frequency amplifier, to whose input there is connected the output of the second selsyn, the latter being mechanically coupled to the phase scale of a measuring dial. The device further includes an output stage amplifier connected to an amplitude value indicator. The function of the phase displacement indicator is performed by an oscillograph with vertical and horizontal scanning. A signal from the second selsyn, which is connected to the phase scale and is a phase shifter, is applied to the vertical scanner of the oscillograph, whereas a signal from the first selsyn is applied to the horizontal scanner of the oscillograph. This results in the appearance of a Lissajous figure on the screen of the oscillograph with high-frequency oscillations superimposed thereon. In order to determine the phase shift, the phase scale is rotated together with the movable selsyn until the curve on the screen of the oscillograph corresponds to zero phase shift. Since the phase scale actually shifts the signal by a value equal to and opposite from the phase shift in the system, the phase shift value is found by directly reading the calibrated scale. Thus, the latter prior art device is more effective than the former prior art instrument that has been described above, as the prior art device under review makes it possible to directly measure the phase shift in degrees without resorting to calculations. This device, however, only measures the amplitude value at the output of the system. In order to determine the module, one has to divide the amplitude value at the output of the system by the amplitude value at the input of the system, which brings additional errors and complications into the measuring process. Due to the fact that a selsyn is used as a phase shifter in this device, the latter does not make it possible to measure low-frequency signal in the range below 0.1 Hz, which means that the frequency range of oscillations being measured is limited. Input action in the given device is done mechanically with the aid of a servomotor, which accounts for considerable errors due to variations in the supply voltage. Besides, the device features low noise immunity and does not allow to measure phase shifts between two arbitrary harmonic signals.

Still another device is known in the prior art for measuring parameters of a dynamic object, which comprises a source of periodic oscillations connected to a dynamic object being investigated, whose output is electrically coupled to an indication unit.

This device makes use of Lissajous figures for phase shift measurements. From the output of the dynamic object being investigated and of the periodic oscillations source, signals are applied to the vertical and horizontal plates of an oscillograph which plays the role of an indicator. As this takes place, an ellipse-like image appears on the screen of the oscillograph. By measuring the ellipse parameters and making some additional calculations one can obtain the phase shift values and the amplitude ratios of the signal being measured.

In order to minimize the errors when using the above prior art device, there must be strict equality between the amplification factors at the horizontal and vertical plates of the oscillograph. In addition, the ellipse must be strictly in the center of the cathode ray tube of the oscillograph. It is practically impossible to comply with the two requirements. Besides, this prior art device is rendered inoperative when acted upon by the noise and constant components of the signal applied from the output of the dynamic object. It also takes much time to covert the ellipse parameters into phase shift values and amplitude ratios. The device is highly sensitive to zero drift of the amplifiers and is inapplicable for studies of non-linear objects.

OBJECTS OF THE INVENTION

It is an object of the present invention to provide a device for measuring parameters of a dynamic object, which device would feature high measurement accuracy in the presence of noise whose amplitude is 10 to 20 times as high as that of signals from linear and non-linear objects under investigation.

It is another object of the present invention to extend the frequency range for measuring parameters of a dynamic object with the aid of the proposed device.

It is still another object of this invention to raise the accuracy of measurements due to the use of the proposed device for measuring parameters of a dynamic object.

It is yet another object of this invention to simplify and accelerate the process of measuring parameters of a dynamic object through the use of the proposed device.

SUMMARY OF THE INVENTION

The foregoing objects of the present invention are attained in a device for measuring parameters of a dynamic object, which device comprises a source of periodic oscillations connected to a dynamic object whose output is electrically coupled to an indication unit. The device has, in accordance with the invention, a difference signal unit with a regulable amplification factor at one of its inputs, whose output is electrically coupled to the indication unit. A regulable phase shift unit has an output connected to a first input of the difference signal unit. A switch electrically connects the output of the source of periodic oscillations and of the dynamic object to the input of the difference signal unit and of the regulable phase shift unit. With this connection, when the switch is in its first position, the output of the dynamic object is connected to a second input of the difference signal unit, and the output of the periodic oscillations source is connected to the input of the regulable phase shift unit. This makes it possible to measure the phase shift of the dynamic object within a range of 0° to −180°, as well as the speed of response, the ratio between the electric signal amplitudes at the output and input of the dynamic object, and the capacitance and inductance of the dynamic object. With the switch in its second position, the output of the periodic oscillations is connected to a second input of the difference signal unit and the output of the dynamic object is connected to the input of the regulable phase shift unit. This makes it possible to measure the phase shift of signals at the input and output of the dynamic object, which phase shift is in excess of −180°, as well as frequency values of the periodic oscillations source.

It is expedient that the regulable phase shift unit include an adder and an operational amplifier connected in parallel with a first input of the adder, connected to whose negative feedback circuit are an adjustable capacitor and a resistor. The capacitor and resistor interconnected in parallel. The input of the regulable phase shift unit is then the common point of connection of the first input of the adder and the input of the operational amplifier, its output being the output of the adder.

It is also expedient that the proposed device additionally include such series connected members as a capacitor, a detector, and a first filter, the capacitor being connected to the output of the difference signal unit, and the first filter being connected to the indication unit.

It is advisable that the proposed device be provided with a second filter with its input being connected to the capacitor and its output, to the detector.

The proposed device for measuring parameters of a dynamic object is intended for measuring phase shifts, amplitude ratios, speed of response, frequency, and electric capacitance and inductance. The device is marked by a high sensitivity and accuracy of measurements carried out within a wide range of frequencies. It is also a multi-purpose device. It further features high noise immunity and low sensitivity to variations in the parameters of its components and the zero drift of the amplifiers, which is due, in particular, to the fact that the regulable phase shift unit is constructed in the form of an adder and of an operational amplifier connected in parallel with the adder, connected to whose negative feedback circuit are a resistor and an adjustable capacitor, said resistor and said capacitor being interconnected in parallel. This is also due to the introduction of a correction circuit made up of a capacitor, a detector, and a filter, the latter three members being connected in series.

DESCRIPTION OF THE DRAWINGS

Other objects and advantages of the present invention will become more apparent from the following detailed description of preferred embodiments thereof to be read in conjunction with the accompanying drawings, wherein.

DISCUSSION OF THE PREFERRED EMBODIMENT

Figure 1:
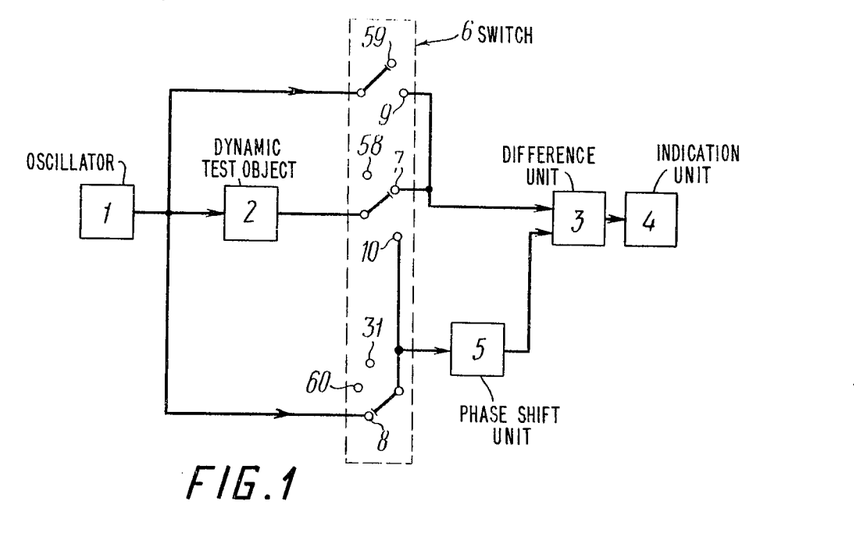
FIG. 1 is a block diagram of a device for measuring parameters of a dynamic object, in accordance with the invention.

Referring now to the accompanying drawings, the proposed device for measuring parameters of a dynamic object comprises a source of periodic oscillations 1 in FIG. 1 connected to a dynamic object 2 under investigation. The device further comprises a difference signal unit 3 with a regulable amplification factor at one of its inputs, whose output is electrically coupled to an indication unit 4. The device also includes a regulable phase shift unit 5 whose output is connected to a first input of the difference signal unit 3.

In order to measure different parameters of the dynamic object 2, the proposed device has a switch 6 which electrically connects the output of the source of periodic oscillations 1 and of the dynamic object 2 to the input of the difference signal unit 3 and of the regulable phase shift unit 5 so that the switch 6 being in its first position 7 and 8, the output of the dynamic object 2 is connected to the input of the difference signal unit 3, whereas the output of the source of periodic oscillations 1 is connected to the input of the regulable phase shift unit 5. This makes it possible to measure the phase shift of the dynamic object 2 within a range of 0° to −180°, and also to carry out measurements of the speed of response, the ratio between the electric signal amplitudes at the input and output of said dynamic object 2, and the capacitance and conductance of its components. With the switch 6 being in its second position 9 and 10, the output of the source of periodic oscillations 1 is connected to the input of the difference signal unit 3, and the output of the dynamic object 2 is connected to the input of the regulable phase shift unit 5. This ensures measurements of the signal phase shift at the input and output of the dynamic object 2, which phase shift is in excess of −180°, as well as of frequency values of the periodic oscillations source 1.

Figure 2:
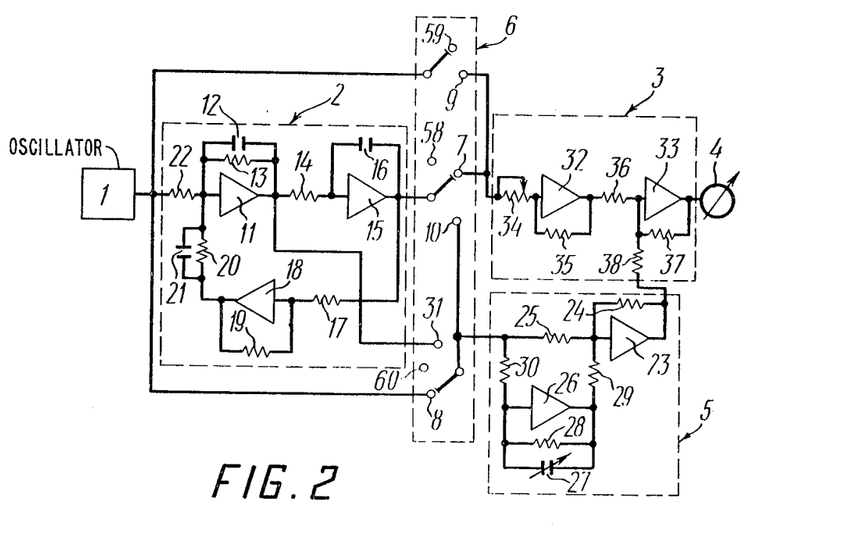
FIG. 2 is a key diagram of a first embodiment of the proposed device, wherein the dynamic object is an automatic control system.

In the first embodiment of the proposed device for measuring parameters of a dynamic object, the latter is an automatic control system which comprises, in series connection, an operational amplifier 11 in FIG. 2, connected to whose negative feedback circuit is a correction circuit made up of a capacitor 12 and a resistor 13, the capacitor and resistor being connected in parallel. The output of the operational amplifier 11 is coupled via a resistor 14 to an integrating amplifier 15, with a capacitor 16 being connected to the negative feedback circuit of said integrating amplifier 15. The output of the amplifier 15 is coupled via a resistor 17 to the input of an inverting amplifier 18, with a resitor 19 being connected to the negative feedback circuit of said amplifier 18. The output of the amplifier 18 is coupled to the input of the amplifier 11 via a resistor 20 and a capacitor 21, the resistor 20 and capacitor 21 being connected in parallel. The input of the amplifier 11 is coupled via a resistor 22 to the output of the source of periodic oscillations 1, the latter's function being performed by a generator built in the conventional manner around semiconductor components (see, for example, S. M. Gerasimov, I. N. Migulin, V. N. Yakovlev "Raschyot polyprovodnikovykh usiliteley i generatorov"/"Circuit Designs of Semiconductor Amplifier and Generators"/, Ukranian Technical Literature Publishers, Kiev, 1961, pp. 201-222).

In the first embodiment under review, the regulable phase shift unit 5 includes an adder 23 build around an operational amplifier, with a resistor 24 being connected to the negative feedback circuit thereof, and a resistor 25 being connected to its input. The unit 5 also includes an operational amplifier 26, with an adjustable capacitor 27 and a resistor 28 being connected to the negative feedback circuit thereof, said capacitor 27 and said resistor 28 being connected in parallel. The amplifier 26 is connected in parallel with a first input of the adder 23 via resistors 29 and 30 connected to the output and the input of the amplifier 26, respectively. With the above circuitry of the unit 5, the input of said unit 5 is the common point of connection of the first input of the adder 23 and of the input of the operational amplifier 26, i.e. the common point of connection of the resistors 25 and 30, whereas the output of the unit 5 is that of the adder 23.

With the switch 6 being in a position 31, the output of the operational amplifier 11 is connected to the input of the regulable phase shift unit 5.

As it has been pointed out hereinabove, the output of the unit 5 is connected to the first input of the difference signal unit 3 which in the embodiment under review is built around an inverting amplifier 32 and an adder 33, said amplifier 32 and said adder 33 being connected in series. The input of the unit 3 is an adjustable resistor 34 connected to the input of the inverting amplifier 32. Connected to the latter's negative feedback circuit is a resistor 35. As is seen from the drawing, the input of the unit 3 is connected via the switch 6 to the output of the integrating amplifier 15 which is part of the dynamic object 2.

The output of the inverting amplifier 32 is connected to an input of the adder 33 via a resistor 36. Connected to the negative feedback circuit of the adder 33 is a resistor 37. Applied to another input of the adder 33 via a resistor 38 is a signal from the output of the adder 23 which is incorporated into the regulable phase shift unit 5.

In this embodiment, the output of the adder 33, which is the output of the difference signal unit 3, is connected to the indication unit 4 whose function is performed by a conventional voltmeter.

With the circuitry of the proposed device as indicated above, the unit 4 records difference signals in measuring signal phase shifts at the input and output of the dynamic object within a range of 0° to −180°, as well as the speed of response. As the switch 6 is brought from the position 8 to the position 31, the unit 4 also registers the amplitude and phase shift ratio of the operational amplifier 11 which is an intermediate component of the dynamic object 2.

Figure 3:
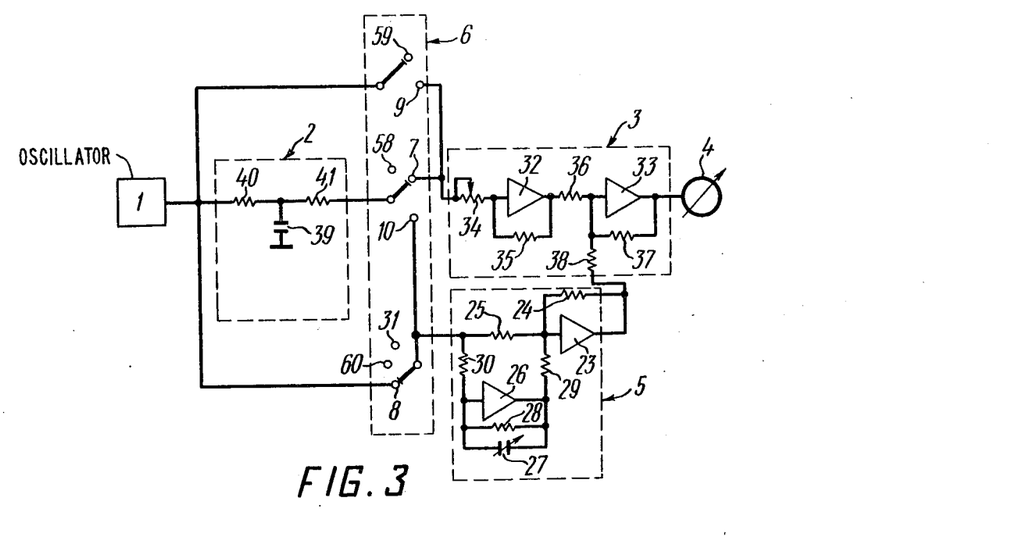
FIG. 3 shows the embodiment of FIG. 2 with a capacitor connected to the common point of connection between two resistors and the ground which perform the function of the dynamic object.

The dynamic object 2 may be a lag network comprising a capacitor 39 in FIG. 3, one of whose plates is grounded, whereas the other is connected to the common point of connection of resistors 40 and 41. With the above arrangement of the units of the proposed device, when the output of the dynamic object 2 is connected to the input of the difference signal unit 3, and the output of the source of periodic oscillations 1 is connected to the input of the regulable phase shift unit 5, the indication unit 4 also registers difference signals while measuring the capacitance value of the capacitor 39.

Figure 4:
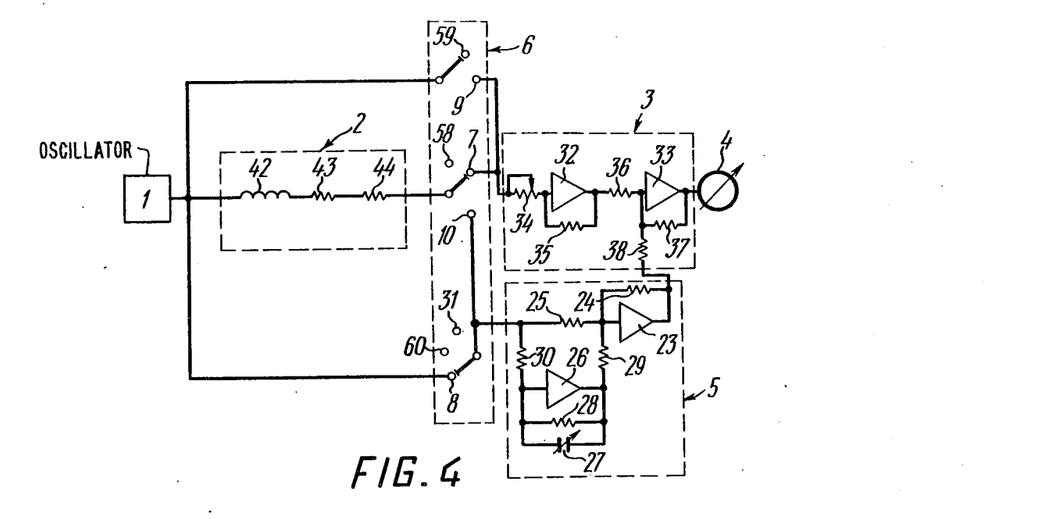
FIG. 4 shows the embodiment of FIG. 2 with an inductance coil and two resistors, all connected in series and performing the function of the dynamic object.
Figure 5:
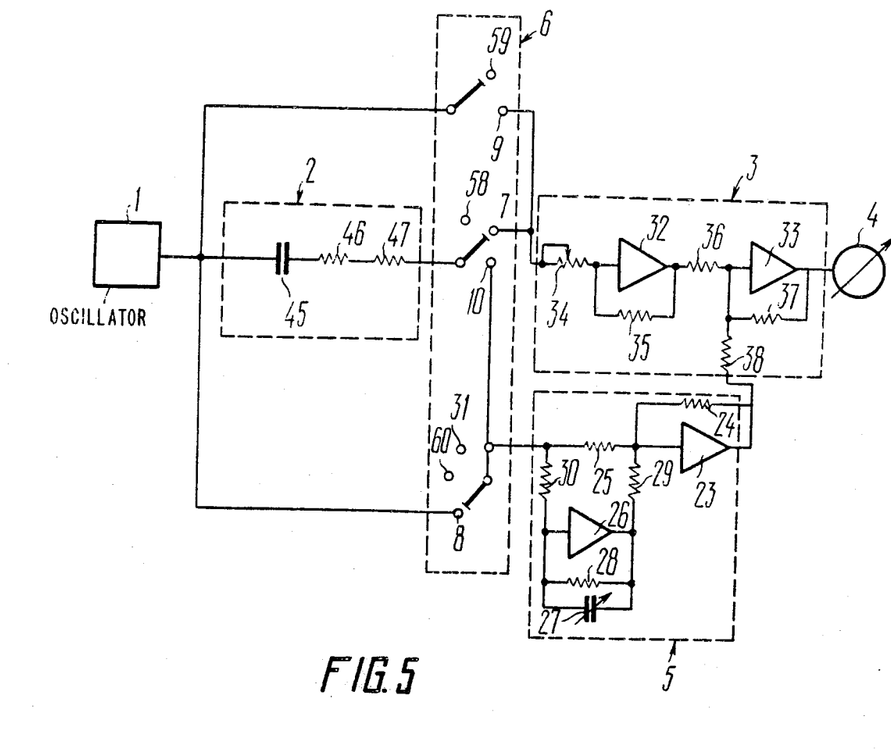
FIG. 5 shows the embodiment of FIG. 2 with a capacitor and two resistors, all connected in series and performing the function of the dynamic object.

The dynamic object 2 may be a lag network comprising, in series connection, an inductance coil 42 in FIG. 4 and resistors 43 and 44, or a capacitor 45 in FIG. 5 and resistors 46 and 47. In this case the proposed device caries out measurements, apart from other parameters, of the inductance value of the coil 42 in FIG. 4 and the capacitance value of the capacitor 45 in FIG. 5.

There may be a second embodiment of the proposed device for measuring parameters of a dynamic object, this second embodiment being similar to the one described above.

Figure 6:
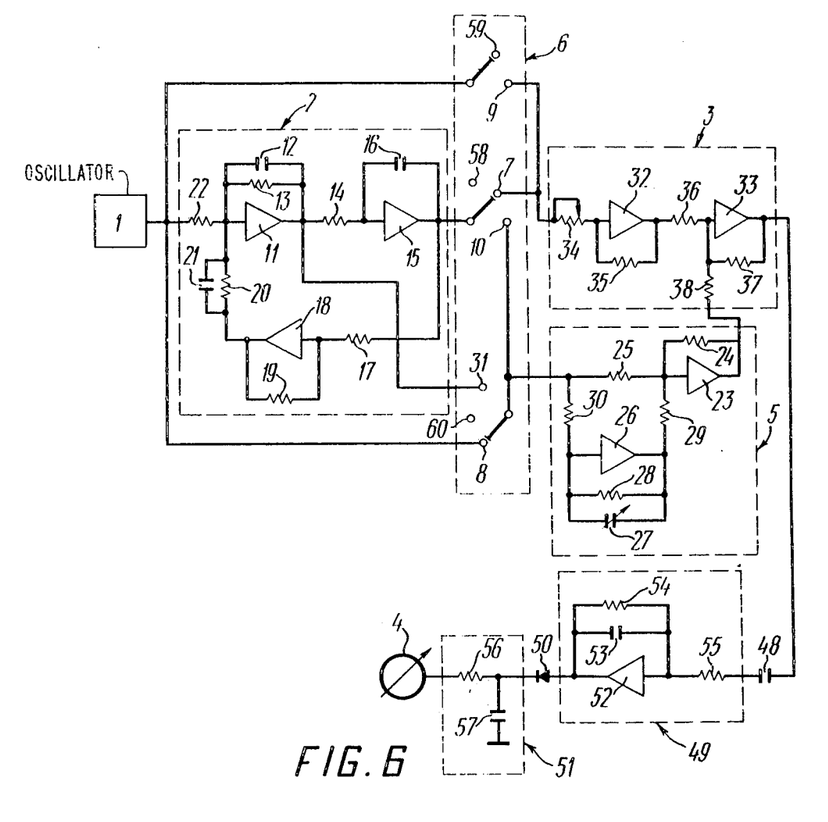
FIG. 6 shows a second embodiment of the proposed device for measuring parameters of a dynamic object.

The second embodiment differs from the first one in that the output of the difference signal unit 3 is electrically coupled to the indication unit 4 via a capacitor 48 in FIG. 6, a first filter 49, a detector 50 and a second filter 51, said capacitor 48, said first filter 49, said detector 50 and said second filter 51 being interconnected in series.

The first filter 49 is built around an operational amplifier 52 with a capacitor 53 and a resistor 54 being connected to the negative feedback circuit thereof, which capacitor 53 and resistor 54 are connected in parallel. The input of the operational amplifier 52 is connected to the capacitor 48 via a resistor 55, whereas its output, which is the output of the filter 49, is connected to the detector 50.

The second filter 51 is constructed in the form of a resistor 56, one lead thereof being connected to the output of the detector 50 and grounded via a capacitor 57, whereas its other lead, which is the output of the filter 51, is connected to the indication unit 4.

The introduction of the circuit made up of the series connected capacitor 48, first filter 49, detector 50 and second filter 51 raises the noise immunity of the device, rules out any decrease in the measurement accuracy due to the zero drift of the amplifiers incorporated in said device, and expands the range of frequencies being measured.

Figure 7:
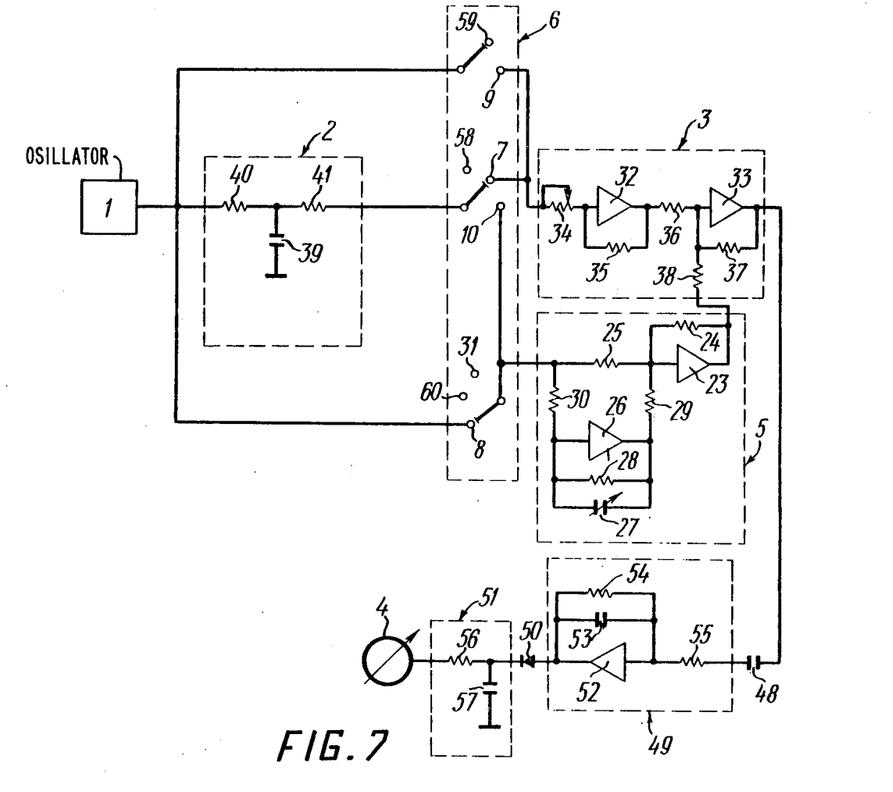
FIG. 7 shows the embodiment of FIG. 6 with a capacitor connected to the common point of connection between two resistors and the ground, which perform the function of the dynamic object.
Figure 8:
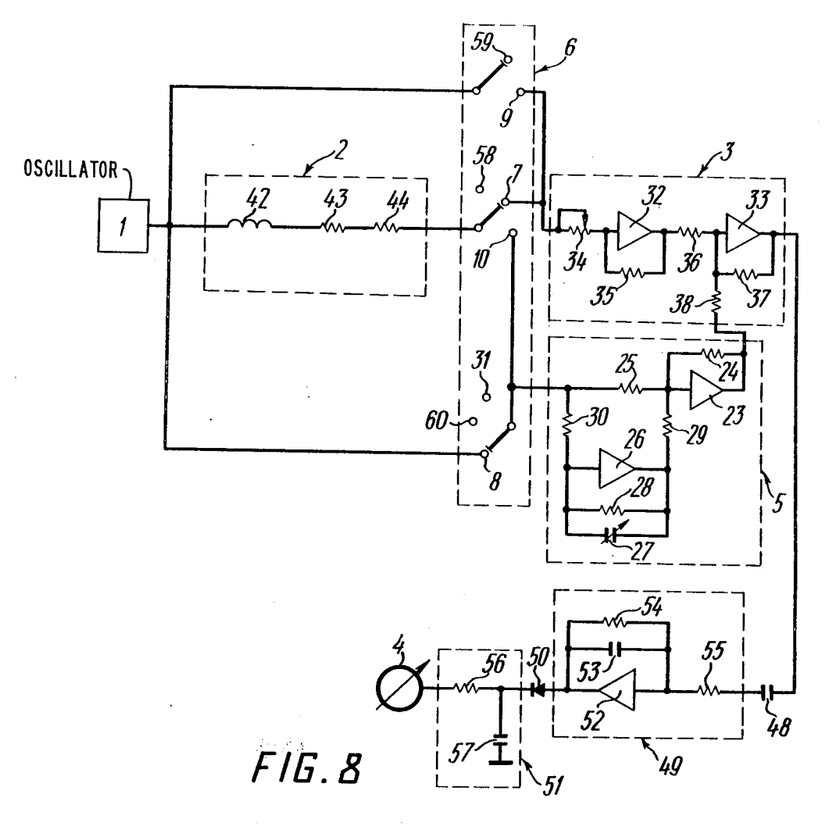
FIG. 8 shows the embodiment of FIG. 6 with an inductance coil and two resistors, all connected in series and performing the function of the dynamic object.
Figure 9:
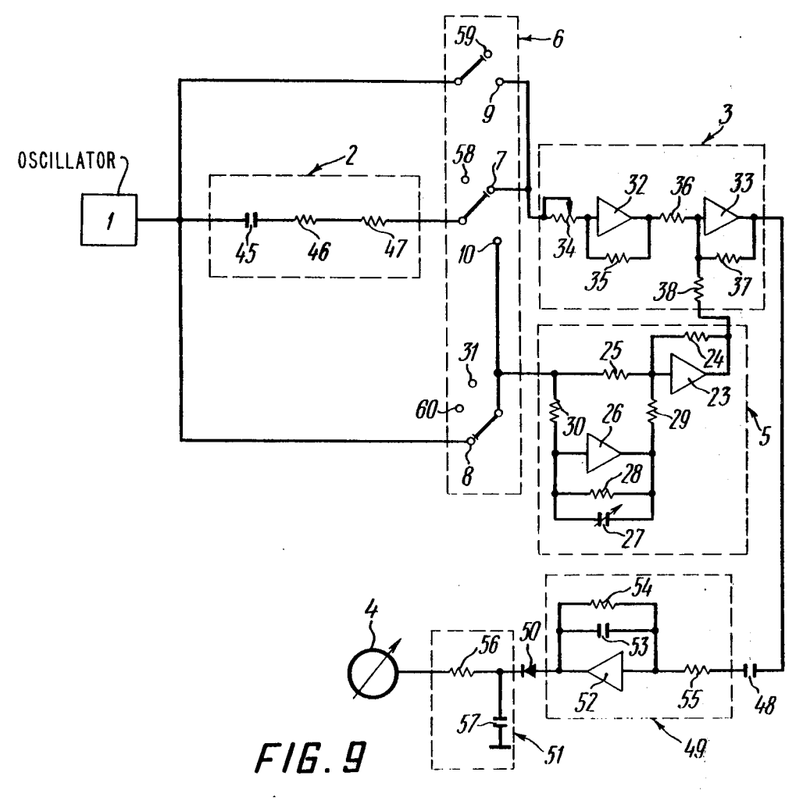
FIG. 9 shows the embodiment of FIG. 6 with a capacitor and two resistors, all connected in series and performing the function of the dynamic object.

FIGS. 7, 8 and 9 show the second embodiment of the proposed device intended for measuring the dynamic objects represented in FIGS. 3, 4, and 5, respectively.

All the accompanying figures, 1 through 9, indicate positions 58, 59 and 60 of the switch 6. Setting switch 6 in these positions disconnects the source of periodic oscillations 1 and the dynamic object 2 from the difference signal unit 3 and the regulable phase shift unit 5.

The proposed device for measuring parameters of a dynamic object operates as follows.

While measuring the signal phase shift at the input and output of the dynamic object 2 in FIG. 2 and the ratio between signal amplitudes at the output and input of said dynamic object 2, the switch 6 is in the positions 8, 58 and 59. In this case a signal is applied from the periodic oscillations source 1 to the input of the regulable phase shift unit 5, and the dynamic object 2 is disconnected from the difference signal unit 3. The capacitance of the capacitor 27 connected to the negative feedback of the operational amplifier 26 reaches zero. The signal value is then measured, which value is registered by the indication unit 4. This is followed by shifting the switch 6 to the positions 7, 59 and 60, so that the indication unit 4 only registers the signal from the output of the dynamic object 2. With the aid of the adjustable resistor 34, which adjusts the amplification factor of the inverting amplifier 32, a value is selected of a signal applied to the indication unit 4, which value is equal to the one measured earlier. The amplification factor of the inverting amplifier 32 is now equal to the ratio between the signal amplitudes at the output of the source of periodic oscillations 1, i.e. at the input of the dynamic object 2 and at the output thereof.

By setting the switch 6 to the positions 7, 8 and 59, signals are applied to the adder 33 from the output of the dynamic object 2 and the source of periodic oscillations 1 via the regulable phase shift unit 5. As this takes place, the capacitance value of the capacitor 28 and, consequently, the time constant $T_o = R_{28} \cdot C_{27}$ is altered to reach a value at which the error signal registered by the indication unit 4 is reduced to a minimum. This means that the phase shift values of the signal of the dynamic object 2 under investigation and of the signal of the regulable phase shift unit 5 are equal.

If we know the frequency $f_o$ of the periodic oscillations source 1 and the value $T_o$ of the regulable phase shift unit 5 we can use the formula $\phi = 2 \, \mathrm{arctg}(T_o \cdot f_o \cdot 2\pi)$ to find the phase shift value between the signal at the output of the dynamic object 2 and that at the output of the periodic oscillations source 1.

In the course of measurement, noise appearing in the dynamic object 2 itself is suppressed by the first filter 49 in FIG. 6, whose inclusion into the circuitry of the proposed device does not require any corrections in measuring said parameters. In addition, the filter 49 discriminates the first harmonic of the signals being measured, which makes it possible to employ the proposed device for investigating both linear and non-linear dynamic objects.

Likewise, the zero drift of the amplifiers 11, 15, 18, 26 and 32 and of the adders 23 and 33, and the constant components of the signals being measured do not affect the accuracy of measuring said parameters, which is due to the presence of the separating capacitor 48.

In order to expand the range of frequencies being measured and to be able to use a pointer instrument in the function of the indication unit 4, because of an increased drift of said pointer instrument, the proposed device includes the detector 50 which, in combination with the filter 51, converts the periodic difference signal applied from the output of the adder 33 and the filter 49 into direct-current voltage.

The measurement of phase shifts of signals at the input and output of the dynamic object 2, which phase shifts are in excess of −180°, is similar to the process described hereinabove, with the only difference that the switch 6 is set into the positions 9, 10 and 60.

In order to measure the frequencies of the periodic oscillations source 1 in FIG. 5 and FIG. 9 playing the role of the dynamic object 2, use is made of a differentiating reference circuit whose phase shift with respect to each frequency is known. In this case the measuring process is identical with that of measuring phase shifts in excess of −180°, with the frequency value being proportional to the value $T_o = C_{27} \cdot R_{28}$.

The measurement of the speed of response of the dynamic object 2 is identical with measuring phase shifts of signals not in excess of −180°. However, the former process differs from the latter in that the function of the source of periodic oscillations is performed in the former case by a square-wave generator whose frequency is proportional to the speed of response of the dynamic object 2 under investigation. The switch 6 is set into the positions 7, 8 and 59 and thus connects the output of the dynamic object 2 to the input of the difference signal unit 3, and the output of the source 1, to the input of the regulable phase shift unit 5. The capacitance of the capacitor 27 is increased from zero to a magnitude at which the signal at the output of the indication unit is not equal to its minimum value. The function $3T_o = C_{27} \cdot R_{28}$ is equal to the speed of response of the dynamic object 2 under investigation, i.e. the time of the transient process measured in seconds. The process of measuring the capacitance of the capacitor 39 in FIG. 3 and FIG. 7 and the inductance of the coil 42 in FIG. 4 and FIG. 8 is identical with that of measuring phase shifts not exceeding −180°. The switch 6 is set in this case into the positions 7, 8 and 59.

The above-mentioned capacitance and inductance values are proportional to the value $T_o = R_{28} \cdot C_{27}$ of the time constant of the regulable phase shift unit 5, at which the error signal of the indication unit 4 is at its minimum.

The measurement of phase shift and amplitude ratios at the output of the dynamic object 2 in FIG. 2 and FIG. 6, i.e. of the automatic control system, and at the output of any of its intermediary components, for example, the amplifier 11, is similar to measuring the phase shifts and amplitude ratios at the output of the dynamic object 2 and the output of the source of periodic oscillations 1. The difference is, however, that in that latter case the switch 6 is set into the positions 7, 31 and 59.

The proposed device is intended for investigating different dynamic objects, such as electric filters, servomotors, servosystems, gyros, turbines, machine tools, autopilots, and different automatic control systems.

The device is a universal measuring instrument for measuring signal phase shifts at the input and output of dynamic objects, the speed of response (the transient process time), the frequency of the periodic oscillations source, and the capacitance and inductance of individual components of dynamic objects.

The device features a high measurement accuracy (not less than 2 percent), despite the presence in the signals being measured of higher harmonics and noise whose amplitude is many times higher than that of the signals being measured.

The device is equally applicable for investigating linear and non-linear dynamic objects. It features a wide range of frequencies being measured (from 0.05 Hz to 10,000 Hz).

The device is highly reliable and simple to manufacture, adjust and operate.

What is claimed is:

1. A device for measuring parameters of a dynamic object, which device comprises a source of periodic oscillations whose output is connected to an input of a dynamic object; a difference signal unit having two inputs, with a regulable amplification factor at one of said inputs, a second one of said inputs being electrically connected to the output of said source of periodic oscillations; a regulable phase shift unit whose output is connected to a first input of said difference signal unit; an indication unit whose input is electrically connected to the output of said difference signal unit; a switch having two positions and electrically connecting the outputs of said source of periodic oscillations and said dynamic object to said second input of said difference signal unit and to the input of the regulable phase shift unit; said switch being capable of assuming a first one of said two positions, to thereby connect the output of said dynamic object to said second input of said difference signal unit and to connect the output of said source of periodic oscillations to the input of said regulable phase shift unit, enabling the measurement of the phase shift of said dynamic object within a range of 0° to −180°, the speed of response, the ratios between the electric signal amplitudes at the output and input of said dynamic object, and the capacitance and inductance of its components; said switch being capable of assuming a second one of said two positions, to thereby connect the output of said source of periodic oscillations to said second input of said difference signal unit, and to connect the output of said dynamic object to the input of said regulable phase shift unit, enabling the measurement of the signal phase shift at the input and output of said dynamic object in excess of −180°, and the frequency values of said source of periodic oscillations.

2. The device as defined in claim 1, wherein said regulable phase shift unit further comprises: an adder having two inputs; an operational amplifier connected in parallel with the first input of said adder; a negative feedback circuit of said operational amplifier; an adjustable capacitor connected to said negative feedback circuit; a resistor, connected to said negative feedback circuit, in parallel with said capacitor; said input of said regulable phase shift unit being the common point of connection of said first input of said adder and the input of said operational amplifier; said output of said regulable phase shift unit being said output of said adder.

3. The device as defined in claim 2, which further comprises: a second capacitor electrically connected to said output of said difference signal unit; a detector whose input is electrically connected to said second capacitor; a second filter, with the output of said detector being connected to its input, and the output of said second filter being connected to the input of said indication unit.

4. The device as defined in claim 3, which further comprises: a first filter having an input connected to said second capacitor and an output connected to the input of said detector.

* * * * *